United States Patent
Hwang

(10) Patent No.: US 8,422,318 B2
(45) Date of Patent: Apr. 16, 2013

(54) SEMICONDUCTOR DEVICE

(75) Inventor: Soo-Man Hwang, Gwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 185 days.

(21) Appl. No.: 12/824,505

(22) Filed: Jun. 28, 2010

(65) Prior Publication Data

US 2011/0007584 A1    Jan. 13, 2011

(30) Foreign Application Priority Data

Jul. 7, 2009 (KR) .................... 10-2009-0061721

(51) Int. Cl.
*G11C 7/00* (2006.01)

(52) U.S. Cl.
USPC .................. 365/191; 365/205; 365/230.06

(58) Field of Classification Search .................. 365/191, 365/205, 230.06, 201, 189.09, 226, 189.11, 365/189.01, 189.07, 185.13

See application file for complete search history.

(56) References Cited

U.S. PATENT DOCUMENTS

| | | | |
|---|---|---|---|
| 6,378,102 B1 * | 4/2002 | Watanabe et al. | 714/763 |
| 2003/0140698 A1 * | 7/2003 | Garverick et al. | 73/514.18 |
| 2005/0152196 A1 * | 7/2005 | Kim | 365/205 |
| 2006/0013051 A1 * | 1/2006 | Lee | 365/205 |
| 2006/0028888 A1 * | 2/2006 | Shin et al. | 365/205 |
| 2008/0037333 A1 * | 2/2008 | Kim et al. | 365/189.02 |

FOREIGN PATENT DOCUMENTS

| | | |
|---|---|---|
| JP | 2000-268568 A | 9/2000 |
| KR | 10-2006-0082320 A | 7/2006 |
| KR | 10-2006-0084630 A | 7/2006 |

* cited by examiner

*Primary Examiner* — Dang Nguyen
(74) *Attorney, Agent, or Firm* — Lee & Morse, P.C.

(57) ABSTRACT

A semiconductor device, including a plurality of control signal generation units each generating a control signal that is enabled when a column enable signal and a row enable signal are enabled, and a plurality of local sense amplifiers each sensing and amplifying data transmitted via a pair of local input/output (I/O) lines and then outputting the amplified data via a pair of global I/O lines, in response to a read or write signal and a corresponding control signal.

10 Claims, 5 Drawing Sheets

SEMICONDUCTOR DEVICE

BACKGROUND

1. Field

Embodiments relate to a semiconductor device.

2. Description of the Related Art

In general, a semiconductor memory device includes a bit-line sense amplifier and a local sense amplifier. The bit-line sense amplifier senses and amplifies data read from a plurality of memory cells and transmits the amplified data to a pair of input and output (I/O) lines. The local sense amplifier senses and amplifies the data transmitted from the pair of local I/O lines and then transmits the amplified data via a pair of global I/O lines.

SUMMARY

It is therefore a feature of an embodiment to provide a semiconductor device capable of selectively operating a desired local sense amplifier from among a plurality of local sense amplifiers.

At least one of the above and other features and advantages may be realized by providing a semiconductor device, including a plurality of control signal generation units each generating a control signal that is enabled when a column enable signal and a row enable signal are enabled, and a plurality of local sense amplifiers each sensing and amplifying data transmitted via a pair of local input/output (I/O) lines and then outputting the amplified data via a pair of global I/O lines, in response to a read or write signal and a corresponding control signal.

Each of the plurality of local sense amplifiers may include an amplification unit for sensing and amplifying the data transmitted via the pair of local I/O lines and then outputting the amplified data, a controller for controlling the amplification unit to operate when the semiconductor device performs a read operation, in response to the read or write signal, and a transmission unit for transmitting the amplified data, which is received from the amplification unit, via the pair of global I/O lines, in response to the control signal.

The amplification unit may include a first transistor having a gate connected to one local I/O line from among the pair of local I/O lines, and a second transistor having a gate connected to the other local I/O line from among the pair of local I/O lines and a first terminal connected to a first terminal of the first transistor. The controller may include a third transistor having a gate to which the read or write signal is supplied, a first terminal to which a ground voltage is applied, and a second terminal connected to the first terminals of the first and second transistors. The transmission unit may include a fourth transistor having a gate to which the control signal is supplied, a first terminal connected to a second terminal of the first transistor, and a second terminal connected to one global I/O line from among the pair of global I/O lines, and a fifth transistor having a gate to which the control signal is supplied, a first terminal connected to a second terminal of the second transistor, and a second terminal connected to the other global I/O line from among the pair of global I/O lines.

Each of the control signal generation units may include an AND gate for performing an AND operation on the column enable signal and the row enable signal, and outputting the performing result.

The semiconductor device may further include a connection unit for connecting the pair of local I/O lines to the pair of global I/O lines when the semiconductor device performs a write operation in response to the read or write signal.

At least one of the above and other features and advantages may also be realized by providing a semiconductor device, including a plurality of control signal generation units each generating a control signal enabled when a column enable signal and a row enable signal are enabled and the semiconductor device does not perform a write operation, and a plurality of local sense amplifiers each sensing and amplifying data transmitted via a pair of local input/output (I/O) lines and then outputting the amplified data via a pair of global I/O lines, in response to a corresponding control signal.

Each of the plurality of local sense amplifiers may include an amplification unit for sensing and amplifying the data transmitted via the pair of local I/O lines and then outputting the amplified data, a controller for controlling the amplification unit to operate when the semiconductor device performs a read operation in response to the control signal, and a transmission unit for transmitting the amplified data, which is received from the amplification unit, to the pair of global I/O lines, in response to the control signal.

The amplification unit may include a first transistor having a gate connected to one local I/O line from among the pair of local I/O lines, and a second transistor having a gate connected to the other local I/O line from among the pair of local I/O lines and a first terminal connected to a first terminal of the first transistor. The controller may include a third transistor having a gate to which the control signal is supplied, a first terminal to which a ground voltage is applied, and a second terminal connected to the first terminals of the first and second transistors. The transmission unit may include a fourth transistor having a gate to which the control signal is supplied, a first terminal connected to a second terminal of the first transistor, and a second terminal connected to one global I/O line from among the pair of global I/O lines, and a fifth transistor having a gate to which the control signal is supplied, a first terminal connected to a second terminal of the second transistor, and a second terminal connected to the other global I/O line from among the pair of global I/O lines.

Each of the plurality of control signal generation units may include an AND gate for performing an AND operation on the column enable signal, the row enable signal, and a read signal.

The semiconductor device may further include a connection unit for connecting the pair of local I/O lines to the pair of global I/O lines when the semiconductor device does not perform a read operation in response to the read signal.

Each of the plurality of control signal generation units may include an inverter for inverting a write signal and outputting a result thereof, and an AND gate for performing an AND operation on the signal received from the inverter, the column enable signal, and the row enable signal, and then outputting the performing result.

The semiconductor device may further include a connection unit for connecting the pair of local I/O lines to the pair of global I/O lines when the semiconductor device performs the write operation in response to the write signal.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
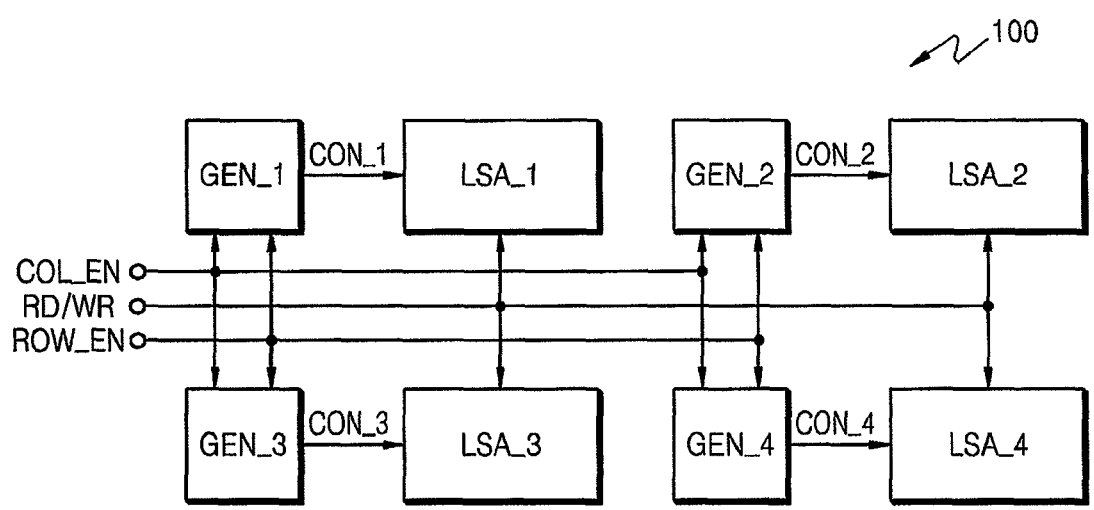
FIG. 1 illustrates a block diagram of a semiconductor device according to an embodiment.

Korean Patent Application No. 10-2009-0061721, filed on Jul. 7, 2009, in the Korean Intellectual Property Office, and entitled: "Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Where an element is shown as being coupled to another element, the element may be directly coupled to the other element, or may be indirectly coupled to the other element via one or more additional elements. Like reference numerals refer to like elements throughout.

FIG. 1 illustrates a block diagram of a semiconductor device 100 according to an embodiment. The semiconductor device 100 may include a plurality of control signal generation units GEN_1, GEN_2, ..., and a plurality of local sense amplifiers LSA_1, LSA_2, .... For convenience of explanation, FIG. 1 illustrates that the semiconductor device 100 includes first through fourth control signal generation units GEN_1, GEN_2, GEN_3, and GEN_4, and first through fourth local sense amplifiers LSA_1, LSA_2, LSA_3, and LSA_4, but the embodiment is not limited thereto. That is, the total number of control signal generation units and the total number of local sense amplifiers are not limited.

The first through fourth control signal generation units GEN_1, GEN_2, GEN_3, and GEN_4 may generate first through fourth control signals CON_1, CON_2, CON_3, and CON_4, respectively, in response to a column enable signal COL_EN and a row enable signal ROW_EN. For example, when the column enable signal COL_EN and the row enable signal ROW_EN are enabled, the first through fourth control signal generation units GEN_1, GEN_2, GEN_3, and GEN_4 may generate an enabled control signal CON and output the first through fourth control signals CON_1, CON_2, CON_3, and CON_4 to the first through fourth local sense amplifiers LSA_1, LSA_2, LSA_3, and LSA_4, respectively. The row enable signal COL_EN instructs that local sense amplifiers in a row be selected from among a plurality of local sense amplifiers that are arranged in rows and columns to be connected to a pair of local input/output (I/O) lines. The column enable signal COL_EN instructs that local sense amplifiers in a column be selected from among the plurality of local sense amplifiers.

The first through fourth local sense amplifiers LSA_1, LSA_2, LSA_3, and LSA_4 may sense and amplify data transmitted via the pair of local I/O lines and then output the amplified data via a pair of global I/O lines, respectively, in response to a read signal RD and the corresponding first to fourth control signals CON_1, CON_2, CON_3, and CON_4. For example, if the read signal RD and the first and third control signals CON_1 and CON_3 are enabled, then the first and third local sense amplifiers LSA_1 and LSA_3 operate but the second and fourth local sense amplifiers LSA_2 and LSA_4 do not operate.

Also, the first through fourth local sense amplifiers LSA_1, LSA_2, LSA_3, and LSA_4 may sense and amplify the data received via the pair of local I/O lines LIO and /LIO and output it via the pair of global I/O lines GIO and /GIO, respectively, in response to a write signal WR and the first to fourth control signals CON_1, CON_2, CON_3, and CON_4. For example, if the write signal WR is disabled and the second and fourth control signals CON_2 and CON_4 are enabled, then the second and fourth local sense amplifiers LSA_2 and LSA_4 operate, but the first and third local sense amplifiers LSA_1 and LSA_3 do not operate.

The operations of only the first control signal generation unit GEN_1 and the first local sense amplifier LSA_1 will now be described with reference to FIGS. 2 and 3 for convenience of explanation. The constructions and operations of the second to fourth control signal generation units GEN_2, GEN_3, and GEN_4 and the second to fourth local sense amplifiers LSA_2, LSA_3, and LSA_4 may be similar to those of the first control signal generation unit GEN_1 and the first local sense amplifier LSA_1 illustrated in FIG. 2 or 3.

Figure 2:
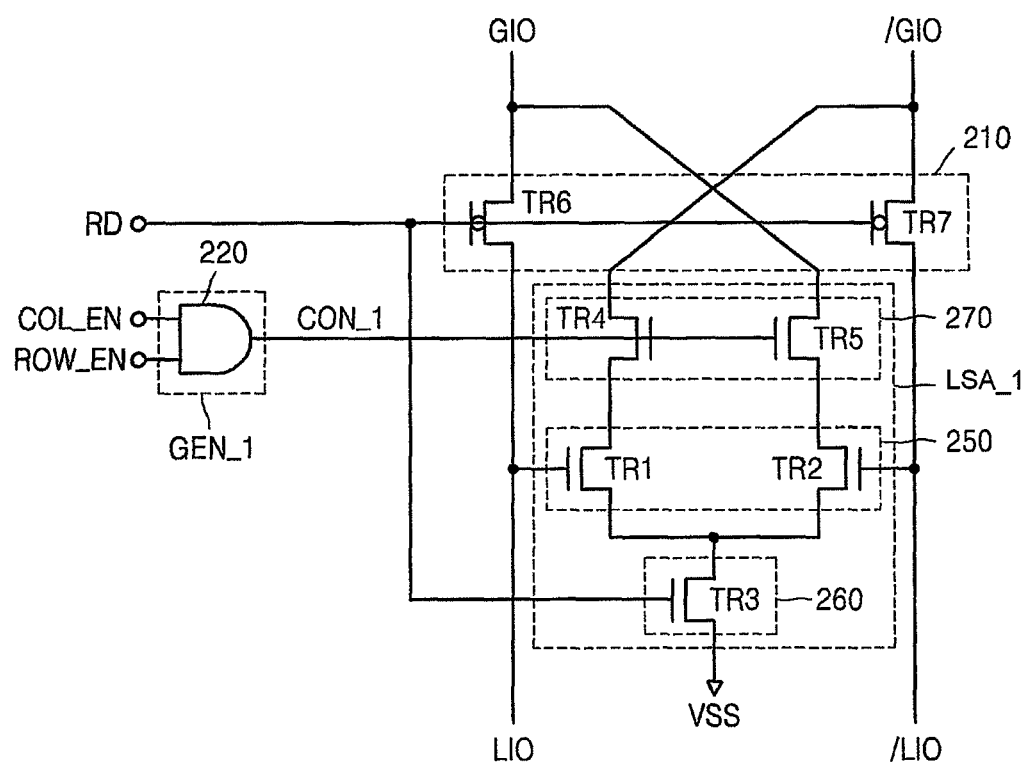
FIG. 2 illustrates a circuit diagram of a first control signal generation unit and a first local sense amplifier included in the semiconductor device of FIG. 1, according to an embodiment.

FIG. 2 illustrates a circuit diagram of a first control signal generation unit GEN_1 and a first local sense amplifier LSA_1 included in the semiconductor device of FIG. 1, according to an embodiment. Referring to FIGS. 1 and 2, the first local sense amplifier LSA_1 may include an amplification unit 250, a controller 260, and a transmission unit 270. The amplification unit 250 senses and amplifies data received via a pair of local I/O lines LIO and /LIO, and outputs the amplified data. The controller 260 controls the amplification unit 250 to operate or not operate according to a read signal RD. Thus, the controller 260 controls the amplification unit 250 to operate when the read signal RD is enabled and the semiconductor device 100 performs a read operation, and controls the amplification unit 250 to not operate when the read signal RD is disabled and the semiconductor device 100 does not perform the read operation. The transmission unit 270 transmits the amplified data, which is received from the output amplification unit 250, via a pair of global I/O lines GIO and /GIO, in response to a first control signal CON_1.

The amplification unit 250 may include a first transistor TR1 and a second transistor TR2. The first transistor TR1 may be connected to a gate of the local I/O line LIO from among the pair of local I/O lines LIO and /LIO. The second transistor TR2 may be connected to the inverted local I/O line /LIO from among the pair of local I/O lines LIO and /LIO, and a first terminal of the second transistor TR2 may be connected to a first terminal of the first transistor TR1.

The controller 260 may include a third transistor TR3 having a gate to which the read signal RD is supplied, a first terminal to which a ground voltage VSS is applied, and a second terminal that is connected to the first terminals of the first and second transistors TR1 and TR2.

The transmission unit 270 may include a fourth transistor TR4 and a fifth transistor TR5. In the fourth transistor TR4, the first control signal CON_1 may be supplied to a gate, a first terminal may be connected to a second terminal of the first transistor TR1, and a second terminal may be connected to the global I/O line GIO from among the pair of global I/O lines GIO and /GIO. In the fifth transistor TR5, the first control signal CON_1 may be supplied to a gate, a first terminal may be connected to a second terminal of the second transistor TR2, and a second terminal may be connected to the inverted global I/O line /GIO from among the pair of global I/O lines GIO and /GIO.

The first control signal generation unit GEN_1 may include a two-input AND gate 220 that performs an AND operation on a column enable signal COL_EN and a row enable signal ROW, and outputs the first control signal CON_1. However, the control signal generation unit GEN_1 is not limited to the AND gate 220 and may be constructed in various ways to generate the first control signal CON_1 enabled when the column enable signal COL_EN and the row enable signal ROW are enabled.

The semiconductor device 100 may further include a connection unit 210. The connection unit 210 may include PMOS transistors TR6 and TR7 that receive the read signal RD. The connection unit 210 may connect the pair of local I/O lines LIO and /LIO to the pair of global I/O lines GIO and /GIO, in response to the read signal RD. For example, the connection unit 210 does not connect the pair of local I/O lines LIO and /LIO to the pair of global I/O lines GIO and /GIO when the read signal RD is enabled and the semiconductor device 100 performs the read operation. The connection unit 210 connects the pair of local I/O lines LIO and /LIO to the pair of global I/O lines GIO and /GIO when the read signal RD is disabled and the semiconductor device 100 does not perform the read operation.

The connection unit 210 may include the sixth transistor TR6 and the seventh transistor TR7. In the sixth transistor TR6, the read signal RD may be supplied to a gate, a first terminal may be connected to the local I/O line LIO from among the pair of local I/O lines LIO and /LIO, and a second terminal may be connected to the global I/O line GIO from among the pair of global I/O lines GIO and /GIO. In the seventh transistor TR7, the read signal RD may be supplied to a gate, a first terminal may be connected to the inverted local I/O line /LIO from among the pair of local I/O lines LIO and /LIO, and a second terminal may be connected to the inverted global I/O line /GIO from among the pair of global I/O lines GIO and /GIO.

In the embodiment described below in connection with FIG. 2, the first to fifth transistor TR1 to TR5 may be NMOS transistors and the sixth and seventh transistors TR6 and TR7 may be PMOS transistors. Further, hereinafter, it is assumed that when a signal is enabled, the signal goes high and when the signal is disabled, the signal goes low. However, the first to fifth transistors TR1 to TR5 may be PMOS transistors and the sixth and seventh transistors TR6 and TR7 may be NMOS transistors by making a simple circuit modification.

The operations of the first control signal generation unit GEN_1, the first local sense amplifier LSA_1, and the connection unit 210 will now be described with reference to FIGS. 1 and 2.

First, when the read signal RD is disabled and the semiconductor device 100 does not perform the read operation, the third transistor TR3 of the controller 260 is turned off, and thus, the first local sense amplifier LSA_1 does not operate. Also, the sixth and seventh transistors TR6 and TR7 of the connection unit 210 are turned on, and thus, the pair of local I/O lines LIO and /LIO are kept connected to the pair of global I/O lines GIO and /GIO.

Next, when the read signal RD is enabled and the semiconductor device 100 performs the read operation, the third transistor TR3 of the controller 260 is turned on and the sixth and seventh transistors TR6 and TR7 of the connection unit 210 are turned off, and thus, the pair of local I/O lines LIO and /LIO are not connected to the pair of global I/O lines GIO and /GIO via the connection unit 210.

If both the column enable signal COL_EN and the row enable signal ROW_EN are enabled, the first control signal generation unit GEN_1 generates and outputs the first control signal CON_1 that is enabled. The fourth and fifth transistors TR4 and TR5 of the transmission unit 270 are turned on in response to the enabled first control signal CON_1. Thus, the amplified data output from the amplification unit 250 is transmitted via the pair of global I/O lines GIO and /GIO. The first or second transistor TR1 or TR2 of the amplification unit 250 is turned on according to a logic state of data transmitted via the pair of local I/O lines LIO and /LIO. For example, if data transmitted via the local I/O line LIO is logic low and data transmitted via the inverted local I/O line /LIO is logic high, then the second, third, and fifth transistors TR2, TR3, and TR5 are turned on. Thus, data that is logic low is transmitted via the global I/O line GIO. In this case, since the first transistor TR1 is turned off and the fourth transistor TR4 is turned on, a power supply voltage (not shown) is applied to the inverted global I/O line /GIO and thus data that is logic high is transmitted via the inverted global I/O line /GIO. As described above, the amplification unit 250 senses, amplifies and outputs data output from the pair of local I/O lines LIO and /LIO.

If the column enable signal COL_EN and/or the row enable signal ROW_EN are disabled, then the first control signal CON_1 is disabled, and the fourth and fifth transistors TR4 and TR5 of the transmission unit 270 are turned off. Thus, the first local sense amplifier LSA_1 does not operate.

Figure 3:
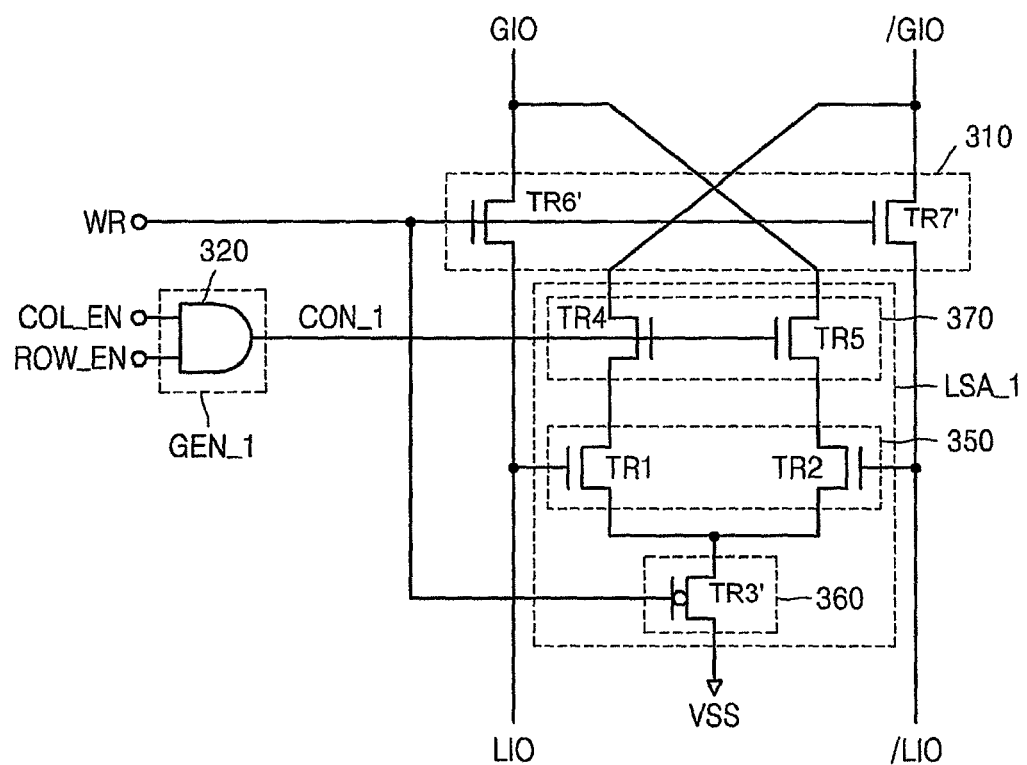
FIG. 3 illustrates a circuit diagram of the first control signal generation unit and the first local sense amplifier included in the semiconductor device of FIG. 1, according to another embodiment.

FIG. 3 illustrates a circuit diagram of the first control signal generation unit GEN_1 and the first local sense amplifier LSA_1 included in the semiconductor device of FIG. 1, according to another embodiment. Compared to FIG. 2, FIG. 3 illustrates a case where a write signal WR is supplied instead of a read signal RD.

Referring to FIG. 3, the first local sense amplifier LSA_1 may include an amplification unit 350, a controller 360, and a transmission unit 370. The operations and constructions of the amplification unit 350 and the transmission unit 370 are similar to those of the amplification unit 250 and the transmission unit 270 of FIG. 2 and thus will not be described again here.

The controller 360 controls the amplification unit 350 to operate or to not operate according to the write signal WR. Thus, if the write signal WR is enabled and the semiconductor device 100 performs a write operation, then the controller 360 controls the amplification unit 350 to not operate. In this case, the controller 360 may include a PMOS transistor TR3. If the write signal WR is disabled and the semiconductor device 100 does not perform the write operation, then the controller 360 controls the amplification unit 350 to operate. The controller 360 may include the third transistor TR3' in which the write signal RD is supplied to a gate, a ground voltage VSS is applied to a first terminal, and a second terminal is connected to first terminals of first and second transistors TR1 and TR2 of the amplification unit 350.

The first control signal generation unit GEN_1 may include a two-input AND gate 320 that performs an AND operation on a column enable signal COL_EN and a row enable signal ROW and outputs a first control signal CON_1. However, the control signal generation unit GEN_1 is not limited to the AND gate 320 and may be constructed in various ways to generate the first control signal CON_1 enabled when the column enable signal COL_EN and the row enable signal ROW are enabled.

The semiconductor device 100 may further include a connection unit 310. The connection unit 310 may connect a pair of local I/O lines LIO and /LIO to a pair of global I/O lines GIO and /GIO, in response to the write signal WR. In this case, the connection unit 310 may include NMOS transistors TR6' and TR7' that receive the write signal WR. For example, if the write signal WR is disabled and the semiconductor device 100 does not perform the write operation, then the connection unit 310 does not connect the pair of local I/O lines LIO and /LIO to the pair of global I/O lines GIO and /GIO. If the write signal WR is enabled and the semiconductor device 100 performs the write operation, then the connection unit 310 connects the pair of local I/O lines LIO and /LIO to the pair of global I/O lines GIO and /GIO.

The connection unit 310 may include the sixth transistor TR6' and the seventh transistor TR7'. In the sixth transistor TR6', the write signal WR may be supplied to a gate, a first terminal may be connected to the local I/O line LIO from among the pair of local I/O lines LIO and /LIO, and a second terminal may be connected to the global I/O line GIO from among the pair of global I/O lines GIO and /GIO. In the seventh transistor TR7', the write signal WR may be supplied to a gate, a first terminal may be connected to the inverted local I/O line /LIO from among the pair of local I/O lines LIO and /LIO, and a second terminal may be connected to the inverted global I/O line /GIO from among the pair of global I/O lines GIO and /GIO.

The first, second, and fourth to seventh transistors TR1, TR2, and TR4 to TR7' may be NMOS transistors, and the third transistor TR3' may be a PMOS transistor. However, the first, second, and fourth to seventh transistors TR1, TR2, and TR4 to TR7' may be PMOS transistors and the third transistor TR3' may be an NMOS transistor by making a simple circuit modification.

The operations of the first control signal generation unit GEN_1, the first local sense amplifier LSA_1, and the connection unit 310 will now be described with reference to FIGS. 1 and 3. Here, it is assumed that when a signal is enabled, the signal goes high and when the signal is disabled, the signal goes low.

First, when the write signal WR is enabled and the semiconductor device 100 performs the write operation, the third transistor TR3' of the controller 360 is turned off. Thus, the first local sense amplifier LSA_1 does not operate. Also, the sixth and seventh transistors TR6' and TR7' of the connection unit 310 are turned on. Thus, the pair of local I/O lines LIO and /LIO are kept connected to the pair of global I/O lines GIO and /GIO.

When the write signal WR is disabled and the semiconductor device 100 does not perform the write operation, the third transistor TR3' of the controller 360 is turned on. Also, the sixth and seventh transistors TR6' and TR7' of the connection unit 310 are turned off. Thus, the pair of local I/O lines LIO and /LIO are not connected to the pair of global I/O lines GIO and /GIO via the connection unit 310.

If both the column enable signal COL_EN and the row enable signal ROW_EN are enabled, the first control signal generation unit GEN_1 generates and outputs the first control signal CON_1 that is enabled. The fourth and fifth transistors TR4 and TR5 of the transmission unit 370 are turned on in response to the enabled first control signal CON_1. Thus, data output from the amplification unit 350 is transmitted via the pair of global I/O lines GIO and /GIO. The first or second transistor TR1 or TR2 of the amplification unit 350 is turned on according to a logic state of data transmitted via the pair of local I/O lines LIO and /LIO. The amplification unit 350 operates in a similar manner to the amplification unit 250 of FIG. 2, and thus, the operation of the amplification unit 350 will not be described again here.

If the column enable signal COL_EN and/or the row enable signal ROW_EN are disabled, then the first control signal CON_1 is disabled, and the fourth and fifth transistors TR4 and TR5 of the transmission unit 370 are turned off. Thus, the first local sense amplifier LSA_1 does not operate.

Figure 4:
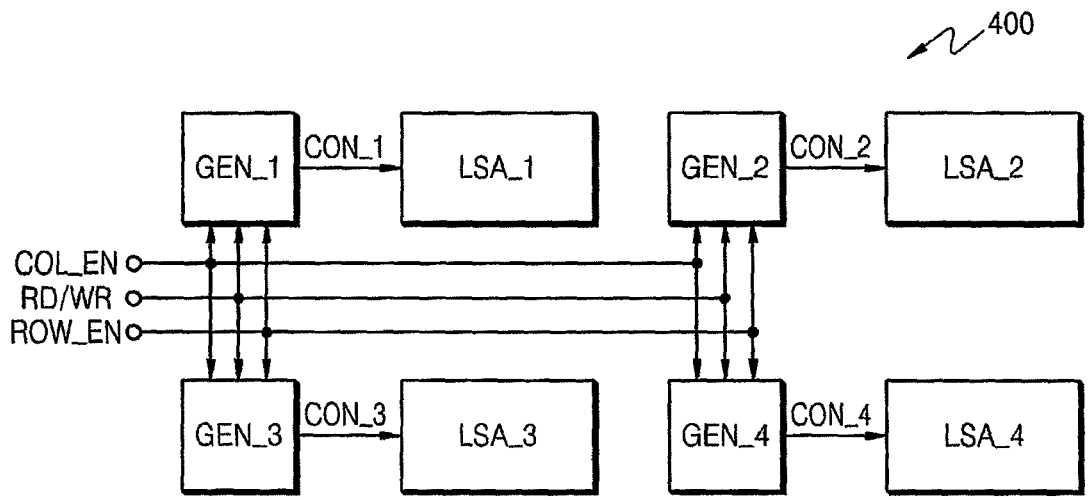
FIG. 4 illustrates a block diagram of a semiconductor device according to another embodiment.

FIG. 4 illustrates a block diagram of a semiconductor device 400 according to another embodiment. The semiconductor device 400 may include a plurality of control signal generation units GEN_1, GEN_2, ..., and a plurality of local sense amplifiers LSA_1, LSA_2, .... For convenience of explanation, FIG. 4 illustrates that the semiconductor device 400 includes first through fourth control signal generation units GEN_1, GEN_2, GEN_3, and GEN_4, and first through fourth local sense amplifiers LSA_1, LSA_2, LSA_3, and LSA_4. However, the embodiment is not limited thereto, and the total number of control signal generation units and the total number of local sense amplifiers are not limited.

The first through fourth control signal generation units GEN_1, GEN_2, GEN_3, and GEN_4 may generate first to fourth control signals CON_1, CON_2, CON_3, and CON_4, respectively, in response to a read signal RD, a column enable signal COL_EN, and a row enable signal ROW_EN. Thus, the first through fourth control signal generation units GEN_1, GEN_2, GEN_3, and GEN_4 generate first to fourth control signals CON_1, CON_2, CON_3, and CON_4 that are enabled and transmit them to the first through fourth local sense amplifier LSA_1, LSA_2, LSA_3, and LSA_4, respectively, when the read signal RD, the column enable signal COL_EN, and the row enable signal ROW_EN are enabled. Also, the first through fourth control signal generation units GEN_1, GEN_2, GEN_3, GEN_4 may generate the first to fourth control signals CON_1, CON_2, CON_3, and CON_4, respectively, in response to a write signal WR, the column enable signal COL_EN, and the row enable signal ROW_EN. Thus, the first through fourth control signal generation units GEN_1, GEN_2, GEN_3, and GEN_4 generate the first to fourth control signals CON_1, CON_2, CON_3, and CON_4 that are enabled and transmit them to the first through fourth local sense amplifiers LSA_1, LSA_2, LSA_3, and LSA_4, respectively, when the write signal WR is disabled and the column enable signal COL_EN and the row enable signal ROW_EN are enabled. The row enable signal COL_EN instructs that local sense amplifiers in a row be selected from among a plurality of local sense amplifiers that are arranged in rows and columns to be connected to a pair of local I/O lines. The column enable signal COL_EN instructs that local sense amplifiers in a column be selected from among the plurality of local sense amplifiers.

The first through fourth local sense amplifiers LSA_1, LSA_2, LSA_3, and LSA_4 may sense and amplify data transmitted via the pair of local I/O lines and then output the amplified data via the pair of global I/O lines, respectively, in response to the first to fourth control signals CON_1, CON_2, CON_3, and CON_4. For example, when the first and second control signals CON_1 and CON_2 are enabled, the first and second local sense amplifiers LSA_1 and LSA_2 operate but the third and fourth local sense amplifiers LSA_3 and LSA_4 do not operate.

For convenience of explanation, the operations of only the first control signal generation unit GEN_1 and the first local sense amplifier LSA_1 of FIG. 4 will now be described with reference to FIGS. 5 and 6. The operations and constructions of the second to fourth control signal generation units GEN_2, GEN_3, and GEN_4 and the second to fourth local sense amplifiers LSA_2, LSA_3, and LSA_4 of FIG. 4 may be similar to those of the first control signal generation unit GEN_1 and the first local sense amplifier LSA_1 illustrated in FIG. 5 or 6.

Figure 5:
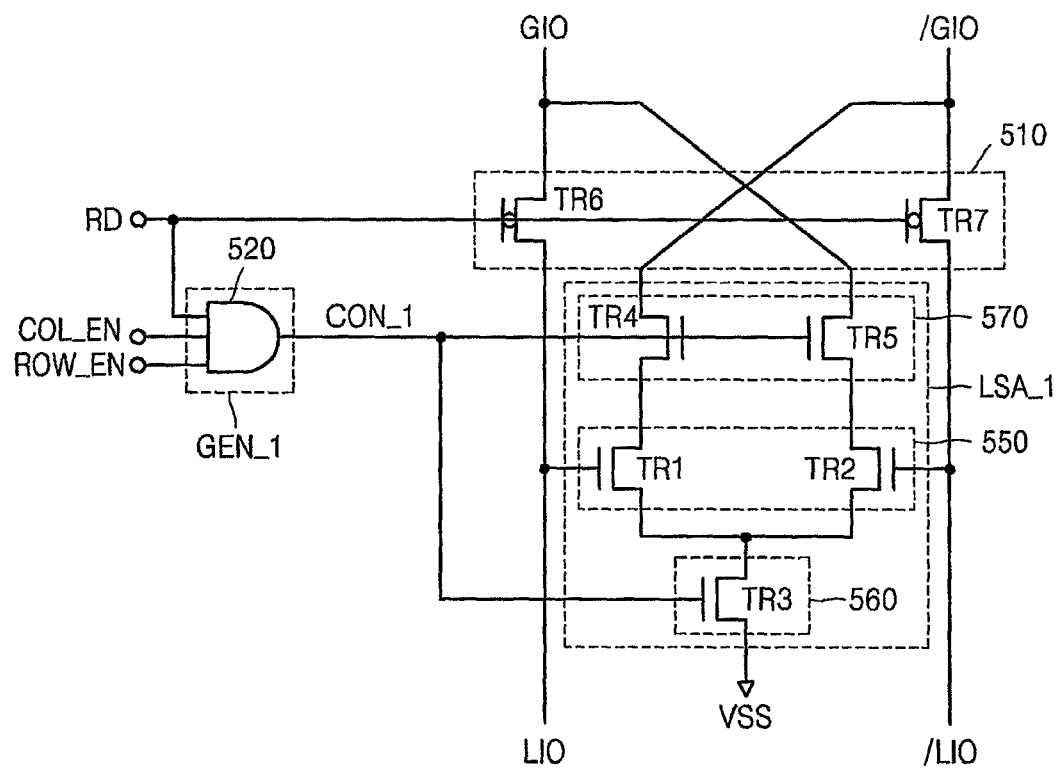
FIG. 5 illustrates a circuit diagram of a first control signal generation unit and a first local sense amplifier included in the semiconductor device of FIG. 4, according to an embodiment.

FIG. 5 illustrates a circuit diagram of a first control signal generation unit GEN_1 and a first local sense amplifier LSA_1 included in the semiconductor device of FIG. 4, according to an embodiment. Referring to FIGS. 4 and 5, the first control signal generation unit GEN_1 may include a three-input AND gate 520 that performs an AND operation on a read signal RD, a column enable signal COL_EN, and a row enable signal ROW and outputs a first control signal CON_1. However, the first control signal generation unit GEN_1 is not limited to the AND gate 520 and may be constructed in various ways to generate the first control signal CON_1 enabled when the read signal RD, the column enable signal COL_EN, and the row enable signal ROW are enabled.

The first local sense amplifier LSA_1 may include an amplification unit 550, a controller 560, and a transmission unit 570. The amplification unit 550 senses and amplifies data transmitted via a pair of local I/O lines LIO and /LIO and outputs the amplified data. The controller 560 controls the amplification unit 350 to operate or to not operate according to the first control signal CON_1. For example, when the semiconductor device 400 performs a read operation and a column enable signal COL_EN and a row enable signal ROW_EN are enabled, the controller 560 controls the amplification unit 550 to operate. The transmission unit 570 transmits the amplified data, which is received from the amplification unit 550, via a pair of global I/O lines GIO and /GIO, in response to the first control signal CON_1.

The amplification unit 550 may include a first transistor TR1 and a second transistor TR2. In the first transistor TR1, a gate may be connected to the local I/O line LIO from among the pair of local I/O lines LIO and /LIO. In the second transistor TR2, a gate may be connected to the inverted local I/O line /LIO from among the pair of local I/O lines LIO and /LIO and a first terminal may be connected to a first terminal of the first transistor TR1.

The controller 560 may include a third transistor TR3 in which the first control signal CON_1 is supplied to a gate, a ground voltage VSS is applied to a first terminal, and a second terminal is connected to first terminals of the first and second transistors TR1 and TR2.

The transmission unit 570 may include a fourth transistor TR4 and a fifth transistor TR5. In the fourth transistor TR4, the first control signal CON_1 may be supplied to a gate, a first terminal may be connected to the second terminal of the first transistor TR1, and a second terminal may be connected to the global I/O line GIO from among the pair of global I/O lines GIO and /GIO. In the fifth transistor TR5, the first control signal CON_1 may be supplied to a gate, a first terminal may be connected to the second terminal of the second transistor TR2, and a second terminal may be connected to the inverted global I/O line /GIO from among the pair of global I/O lines GIO and /GIO.

The semiconductor device 400 may further include a connection unit 510. The connection unit 510 may connect the pair of local I/O lines LIO and /LIO to the pair of global I/O lines GIO and /GIO, in response to a read signal RD. The connection unit 510 may include PMOS transistors TR6 and TR7 that receive the read signal RD. Thus, when the read signal RD is enabled and the semiconductor device 400 performs a read operation, the connection unit 510 does not connect the pair of local I/O lines LIO and /LIO to the pair of global I/O lines GIO and /GIO. When the read signal RD is disabled and the semiconductor device 400 does not perform the read operation, the connection unit 510 connects the pair of local I/O lines LIO and /LIO to the pair of global I/O lines GIO and /GIO.

The connection unit 510 may include the sixth transistor TR6 and the seventh transistor TR7. In the sixth transistor TR6, the read signal RD may be supplied to a gate, a first terminal may be connected to the local I/O line LIO from among the pair of local I/O lines LIO and /LIO, and a second terminal may be connected to the global I/O line GIO from among the pair of global I/O lines GIO and /GIO. In the seventh transistor TR7, the read signal RD may be connected to a gate, a first terminal may be connected to the inverted local I/O line /LIO from among the pair of local I/O lines LIO and /LIO, and a second terminal may be connected to the inverted global I/O line /GIO from among the pair of global I/O lines GIO and /GIO.

The first to fifth transistor TR1 to TR5 may be NMOS transistors and the sixth and seventh transistors TR6 and TR7 may be PMOS transistors. However, the first to fifth transistors TR1 to TR5 may be PMOS transistors and the sixth and seventh transistors TR6 and TR7 may be NMOS transistors by making a simple circuit modification.

The operations of the first control signal generation unit GEN_1, the first local sense amplifier LSA_1, and the connection unit 510 will now be described with reference to FIGS. 4 and 5. Here, it is assumed that when a signal is enabled, the signal goes high and when the signal is disabled, the signal goes low.

First, when the read signal RD is disabled and the semiconductor device 400 does not perform the read operation, the first control signal generation unit GEN_1 generates and outputs the first control signal CON_1 that is disabled. The third transistor TR3 of the controller 560 and the fourth and fifth transistors TR4 and TR5 of the transmission unit 570 are turned off in response to the disabled first control signal CON_1. Thus, the first local sense amplifier LSA_1 does not operate. Also, the sixth and seventh transistors TR6 and TR7 of the connection unit 510 are turned on. Thus, the pair of local I/O lines LIO and /LIO are kept connected to the pair of global I/O lines GIO and /GIO.

Next, a case where the read signal RD is enabled and the semiconductor device 400 performs the read operation will now be described.

If both the column enable signal COL_EN and the row enable signal ROW_EN are enabled, the first control signal generation unit GEN_1 generates and outputs the first control signal CON_1 that is enabled. The third transistor TR3 of the controller 560, and the fourth and fifth transistors TR4 and TR5 of the transmission unit 570, are turned on in response to the enabled first control signal CON_1. Thus, the amplification unit 550 senses and amplifies data transmitted via the pair of local I/O lines LIO and /LIO, and the transmission unit 570 transmits the amplified data, which is received from the amplification unit 550, via the pair of global I/O lines GIO and /GIO. The first or second transistor TR1 or TR2 of the amplification unit 550 is turned on according to a logic state of data transmitted via the pair of local I/O lines LIO and /LIO. For example, if data transmitted via the local I/O line LIO is logic low and data transmitted via the inverted local I/O line /LIO is logic high, then the second transistor TR2, the third transistor TR3, and the fifth transistor TR5 are turned on. Thus, the data that is logic low is transmitted via the global I/O line GIO. In this case, since the first transistor TR1 is turned off and the fourth transistor TR4 is turned on, a power supply voltage (not shown) is applied to the inverted global I/O line /GIO. Thus, the data that is logic high is transmitted via the inverted global I/O line /GIO. As described above, the amplification unit 550 senses and amplifies data transmitted via the pair of local I/O lines LIO and /LIO and then outputs the amplified data.

In the AND gate 520, if the column enable signal COL_EN and/or the row enable signal ROW_EN are disabled, the first control signal CON_1 is disabled even when the read signal RD is disabled. Accordingly, the third transistor TR3 of the controller 550, and the fourth and fifth transistors TR4 and TR5 of the transmission unit 570, are turned off. Thus, the first local sense amplifier LSA_1 does not operate.

Figure 6:
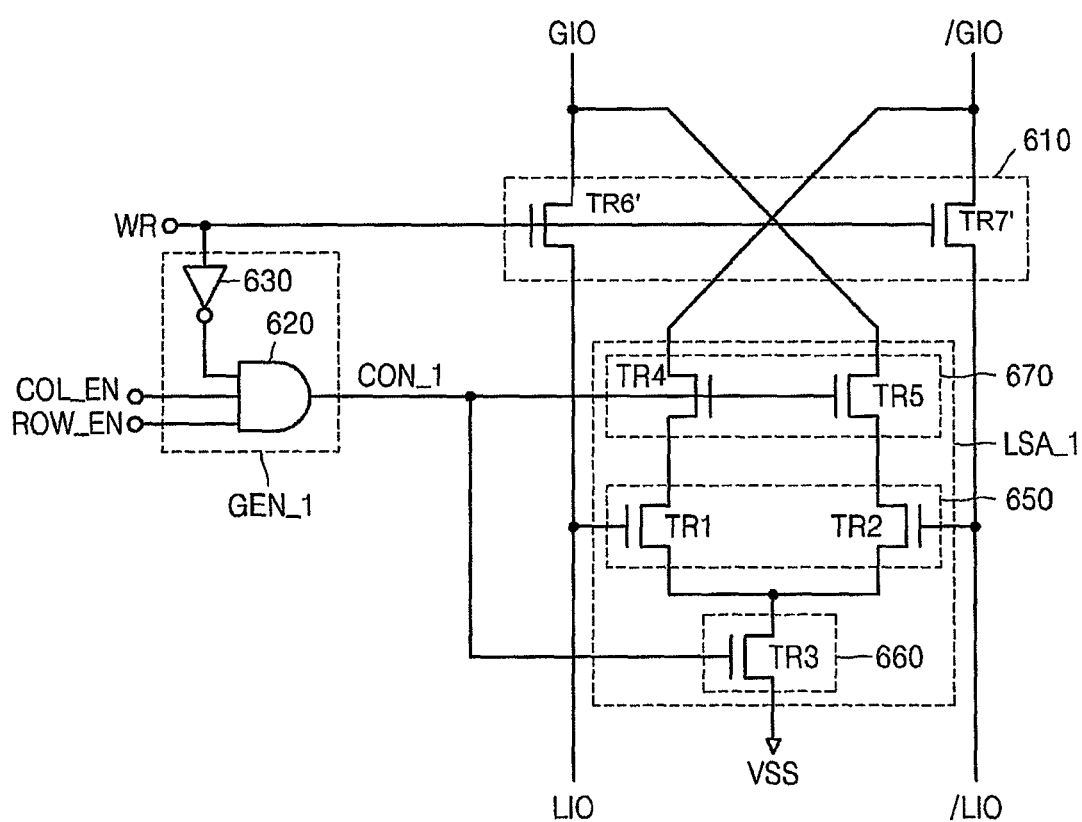
FIG. 6 illustrates a circuit diagram of the first control signal generation unit and the first local sense amplifier included in the semiconductor device of FIG. 4, according to another embodiment.

FIG. 6 illustrates a circuit diagram of the first control signal generation unit GEN_1 and the first local sense amplifier LSA_1 included in the semiconductor device of FIG. 4, according to another embodiment. Compared to FIG. 5, FIG. 6 illustrates a case where a write signal WR is supplied instead of the read signal RD.

The first control signal generation unit GEN_1 may include a three-input AND gate 620, one of the inputs thereof receiving the output of an inverter 630. The inverter 630 inverts the write signal WR and outputs the resulting inverted signal. The AND gate 620 performs an AND operation on a column enable signal COL_EN, a row enable signal ROW, and the inverted write signal WR received from the inverter 630, and then outputs a first control signal CON_1. However, the construction of the control signal generation unit GEN_1 is not limited to the structure illustrated in FIG. 6 and may be constructed in various ways to generate the first control signal CON_1 enabled when the semiconductor device 400 does not perform a write operation and both the column enable signal COL_EN and the row enable signal ROW are enabled.

The first local sense amplifier LSA_1 may include an amplification unit 650, a controller 660, and a transmission unit 670. The constructions and operations of the amplification unit 650, the controller 660, and the transmission unit 670 are similar to those of the amplification unit 550, the controller 560, and the transmission unit 570 of FIG. 5 and thus will not be described again here.

The semiconductor device 400 may further include a connection unit 610. The connection unit 610 may include NMOS transistors TR6' and TR7' that receive the write signal WR. The connection unit 610 may connect a pair of local I/O lines LIO and /LIO to a pair of global I/O lines GIO and /GIO, in response to the write signal WR. For example, when the write signal WR is disabled and the semiconductor device 400 does not perform the write operation, the connection unit 610 does not connect the pair of local I/O lines LIO and /LIO to the pair of global I/O lines GIO and /GIO. When the write signal WR is enabled and the semiconductor device 400 performs the write operation, the connection unit 610 connects the pair of local I/O lines LIO and /LIO to the pair of global I/O lines GIO and /GIO.

The connection unit 610 may include the sixth transistor TR6' and the seventh transistor TR7'. In the sixth transistor TR6', the write signal WR may be supplied to a gate, a first terminal may be connected to the local I/O line LIO from among the pair of local I/O lines LIO and /LIO, and a second terminal may be connected to the global I/O line GIO from among the pair of global I/O lines GIO and /GIO. In the seventh transistor TR7, the write signal WR may be supplied to a gate, a first terminal may be connected to the inverted local I/O line /LIO from among the pair of local I/O lines LIO and /LIO, and a second terminal may be connected to the global I/O line /GIO from among the pair of global I/O lines GIO and /GIO.

The first to seventh transistor TR1 to TR7' may all be NMOS transistors, but may be PMOS transistors by making a simple circuit modification.

The operations of the first control signal generation unit GEN_1, the first local sense amplifier LSA_1, and the connection unit 610 will now be described with reference to FIGS. 4 and 6. Here, it is assumed that when a signal is enabled, the signal goes high and when the signal is disabled, the signal goes low.

First, when the write signal WR is enabled and the semiconductor device 400 performs the write operation, the first control signal generation unit GEN_1 generates and outputs the first control signal CON_1 that is disabled. The third transistor TR3 of the controller 660 and the fourth and fifth transistors TR4 and TR5 of the transmission unit 670 are turned off in response to the disabled first control signal CON_1. Thus, the first local sense amplifier LSA_1 does not operate. Also, the sixth and seventh transistors TR6' and TR7' of the connection unit 610, which receive the write signal WR, are turned on. Thus, the pair of local I/O lines LIO and /LIO are kept connected to the pair of global I/O lines GIO and /GIO.

Next, a case where the write signal WR is disabled and the semiconductor device 400 does not perform the write operation will now be described.

The disabled write signal WR is input to the inverter 630, and an enabled, i.e., inverted, signal is thus input to the AND gate 620. If both the column enable signal COL_EN and the row enable signal ROW_EN are enabled, the first control signal generation unit GEN_1 generates and outputs the first control signal CON_1 that is enabled. The third transistor TR3 of the controller 660 and the fourth and fifth transistors TR4 and TR5 of the transmission unit 670 are turned on in response to the enabled first control signal CON_1. Thus, the amplification unit 650 senses and amplifies data transmitted via the pair of local I/O lines LIO and /LIO, and the transmission unit 670 transmits the amplified data, which is received from the amplification unit 650, via the pair of global I/O lines GIO and /GIO. The first or second transistor TR1 or TR2 of the amplification unit 650 is turned on according to a logic state of the data transmitted via the pair of local I/O lines LIO and /LIO. The operation of the amplification unit 650 is similar to that of the amplification unit 550 of FIG. 5 and thus will not be described again here.

If the column enable signal COL_EN and/or the row enable signal ROW_EN are disabled, the first control signal CON_1 is disabled even when the write signal WR is disabled. Accordingly, the third transistor TR3 of the controller 650 and the fourth and fifth transistors TR4 and TR5 of the transmission unit 670 are turned off. Thus, the first local sense amplifier LSA_1 does not operate.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A semiconductor device, comprising:
a plurality of control signal generation units, a first control signal generation unit among the plurality of control signal generating units generating a first control signal by a logical AND of a column enable signal and a row enable signal; and a plurality of local sense amplifiers, a first local sense amplifier among the plurality of local sense amplifiers receiving the first control signal from the first control signal generation unit, the first local sense amplifier sensing and amplifying data transmitted via a pair of local input/output (I/O) lines and then outputting the amplified data via a pair of global I/O lines, in response to a read or write signal and the received first control signal, wherein the first local sense amplifier includes:

a first transistor having a gate connected to one local I/O line from among the pair of local I/O lines, a first terminal, and a second terminal;

a second transistor having a gate connected to the other local I/O line from among the pair of local I/O lines, a first terminal connected to the first terminal of the first transistor, and a second terminal;

a third transistor having a gate to which the read or write signal is supplied, a first terminal to which a ground voltage is applied, and a second terminal connected to the first terminals of the first and second transistors;

a fourth transistor having a gate to which the first control signal is supplied, a first terminal connected to the second terminal of the first transistor, and a second terminal connected to one global I/O line from among the pair of global I/O lines;

a fifth transistor having a gate connected to the gate of the fourth transistor, a first terminal connected to the second terminal of the second transistor, and a second terminal connected to the other global I/O line from among the pair of global I/O lines;

a sixth transistor having a gate connected to the gate of the third transistor, a first terminal connected to the gate of the first transistor, and a second terminal connected to the second terminal of the fifth transistor; and a seventh transistor having a gate connected to the gate of the third transistor, a first terminal connected to the gate of the second transistor, and a second terminal connected to the second terminal of the fourth transistor.

2. The semiconductor device as claimed in claim 1, wherein the first local sense amplifier includes:

an amplification unit for sensing and amplifying the data transmitted via the pair of local I/O lines and then outputting the amplified data;

a controller for controlling the amplification unit to operate when the semiconductor device performs a read operation, in response to the read or write signal; and a transmission unit receiving the first control signal, the transmission unit transmitting the amplified data, which is received from the amplification unit, via the pair of global I/O lines, in response to the first control signal.

3. The semiconductor device as claimed in claim 2, wherein:

the amplification unit includes the first and second transistors, the controller includes the third transistor, and the transmission unit includes the fourth and fifth transistors.

4. The semiconductor device as claimed in claim 1, wherein the first control signal generation unit includes an AND gate for performing an AND operation on the column enable signal and the row enable signal, and outputting the performing result as the first control signal, the first control signal having a high level whenever the column enable signal and the row enable signal both have a high level.

5. The semiconductor device as claimed in claim 1, further including a connection unit for connecting the pair of local I/O lines to the pair of global I/O lines when the semiconductor device performs a write operation in response to the read or write signal.

6. The semiconductor device as claimed in claim 1, wherein the column enable signal is for selecting local sense amplifiers in a column including the first local sense amplifier among the plurality of local sense amplifiers arranged in rows and columns.

7. The semiconductor device as claimed in claim 1, wherein the row enable signal is for selecting local sense amplifiers in a row including the first local sense amplifier among the plurality of local sense amplifiers arranged in rows and columns.

8. The semiconductor device as claimed in claim 1, wherein the first control signal is for selecting local sense amplifiers including the first local sense amplifier among the plurality of local sense amplifiers arranged in rows and columns, the selected local sense amplifiers are included in local sense amplifiers in a column selected among the plurality of local sense amplifiers by the column enable signal and local sense amplifiers in a row selected among the plurality of local sense amplifiers by the row enable signal.

9. The semiconductor device as claimed in claim 1, wherein the read or write signal is a read signal, when the read signal is enabled, the semiconductor device performs a read operation, the third transistor is turned on, and the sixth and seventh transistors are turned off, and when the read signal is disabled, the semiconductor device does not perform the read operation, the third transistor is turned off, and the sixth and seventh transistors are turned on.

10. The semiconductor device as claimed in claim 1, wherein the read or write signal is a write signal, and when the write signal is enabled, the semiconductor device performs a write operation, the third transistor is turned off, and the sixth and seventh transistors are turned on, and when the write signal is disabled, the semiconductor device does not perform the write operation, the third transistor is turned on, and the sixth and seventh transistors are turned off.

* * * * *